(12) United States Patent
Yamamoto et al.

(10) Patent No.: US 10,374,490 B2
(45) Date of Patent: Aug. 6, 2019

(54) ELECTRONIC DEVICE AND DRIVE DEVICE INCLUDING THE SAME

(71) Applicant: DENSO CORPORATION, Kariya, Aichi-pref. (JP)

(72) Inventors: Toshihisa Yamamoto, Anjo (JP); Hideki Kabune, Nagoya (JP); Yuuta Kadoike, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 385 days.

(21) Appl. No.: 14/811,601

(22) Filed: Jul. 28, 2015

(65) Prior Publication Data

US 2016/0036298 A1 Feb. 4, 2016

(30) Foreign Application Priority Data

Jul. 31, 2014 (JP) ................................ 2014-156479

(51) Int. Cl.
*H02K 9/22* (2006.01)
*H02K 11/00* (2016.01)
(Continued)

(52) U.S. Cl.
CPC ........... *H02K 9/22* (2013.01); *H02K 11/0073* (2013.01); *H02K 11/33* (2016.01); *H05K 7/205* (2013.01);
(Continued)

(58) Field of Classification Search
CPC .......... H02K 11/00–11/40; H02K 9/22; H02K 11/30; H02K 11/33; H02K 11/35; H02K 11/38
(Continued)

(56) References Cited

U.S. PATENT DOCUMENTS 6,297,959 B1  10/2001  Ueno et al.
2001/0050843 A1  12/2001  Ueno et al.
(Continued)

FOREIGN PATENT DOCUMENTS

JP  2002-50722 A  2/2002
JP  2006-313768 A  11/2006
(Continued)

OTHER PUBLICATIONS

Machine Translation, BETSUSHIBA, JP-2012174965-A, Sep. 2012. (Year: 2012).*

*Primary Examiner* — Thomas Truong
(74) *Attorney, Agent, or Firm* — Knobbe, Martens, Olson & Bear, LLP

(57) ABSTRACT

An electronic device includes a heat sink, where heat dissipating gel is interposed between the heat sink and a side of an electronic component, which is mounted on a substrate, opposite from the substrate. The electronic component includes an electrical conductor electrically connected to a chip, and an insulator portion that molds the chip with the electrical conductor. The heat sink includes a non-abutting surface that faces the electrical conductor of the electronic component, the heat dissipating gel interposed between the non-abutting surface and the electrical conductor, and an abutting surface that is positioned closer toward the substrate than the non-abutting surface is and abuttable with the insulator portion. Accordingly, when the abutting surface of the heat sink abuts the insulator portion of the electronic component, the non-abutting surface of the heat sink is prevented from abutting the electrical conductor of the electronic component.

17 Claims, 13 Drawing Sheets

(51) Int. Cl.
*H05K 7/20* (2006.01)
*H02K 11/33* (2016.01)
(52) U.S. Cl.
CPC ......... *H05K 7/209* (2013.01); *H05K 7/20454* (2013.01); *H05K 7/20463* (2013.01)
(58) Field of Classification Search
USPC ...... 310/68 A–68 E, 68 R, 64; 361/688, 704, 361/711, 719
See application file for complete search history.

(56) References Cited

U.S. PATENT DOCUMENTS

| | | | |
|---|---|---|---|
| 2003/0184969 A1 | 10/2003 | Itabashi et al. | |
| 2004/0233640 A1 | 11/2004 | Itabashi et al. | |
| 2010/0254093 A1* | 10/2010 | Oota | B60R 16/0239 361/720 |
| 2011/0013370 A1* | 1/2011 | Oota | H01L 23/42 361/752 |
| 2012/0091573 A1* | 4/2012 | Sasaki | H01L 23/3107 257/717 |
| 2012/0326292 A1* | 12/2012 | Ohashi | H01L 23/3677 257/690 |
| 2014/0225482 A1* | 8/2014 | Hara | H02K 5/22 310/68 D |
| 2014/0293548 A1* | 10/2014 | Besshi | H01L 23/3107 361/715 |
| 2015/0029673 A1 | 1/2015 | Kadoike et al. | |

FOREIGN PATENT DOCUMENTS

| | | | |
|---|---|---|---|
| JP | 2012-4358 A | 6/2010 | |
| JP | 2012174965 A * | 9/2012 | ............ H01L 24/34 |
| WO | WO-2013099545 A1 * | 7/2013 | ........... H01L 23/310 |

\* cited by examiner

ELECTRONIC DEVICE AND DRIVE DEVICE INCLUDING THE SAME

CROSS REFERENCE TO RELATED APPLICATION

The present application is based on Japanese Patent Application No. 2014-156479 filed on Jul. 31, 2014, disclosure of which is incorporated herein by reference.

TECHNICAL FIELD

The present disclosure relates to an electronic device where electronic components are mounted on a substrate, and relates to a drive device including the electronic device.

BACKGROUND

In general, an electronic component of a semiconductor package and the like may include a chip formed from semiconductor elements, an electrical conductor (or terminal) that is electrically connected to the chip, and a mold resin or the like that molds the chip with the electrical conductor. This electronic component, when energized, may generate heat.

JP 2002-050722A describes an electronic device including a heat sink, where an electronic component is mounted on a substrate. A heat conducting sheet is interposed between the heat sink and a side of the electronic component opposite from the substrate. When the electronic component is energized and generates heat, this electronic device dissipates the heat to the heat sink through the heat conducting sheet.

SUMMARY

Incidentally, in the electronic component, the electrical conductor, which is electrically connected to the chip, may be exposed at a side of the mold resin opposite from the substrate. The electronic device may improve the heat dissipating property of the electronic component by dissipating the heat generated from the electronic component to the heat sink through the electrical conductor exposed at the side of the mold resin opposite from the substrate. In that case, the electronic device may have heat dissipating gel applied such that a layer of air is not formed between the electronic component and the heat sink.

In this case, an insulation gap between the electrical conductor of the electronic component and the heat sink may decrease if, for example, the electrical component is mounted in a tilted state with respect to the substrate, or if the substrate warps due to temperature changes. As a result, there is a concern that a short circuit may occur between the electrical conductor and the heat sink.

To prevent this kind of short circuit, the insulation gap between the electrical conductor of the electrical component and the heat sink may be set to be large. However, there is a concern that, by doing so, the physical size of the electrical device may increase, the heat dissipating property of the electronic component may degrade, an increased amount of the heat dissipating gel may be used, or the like.

It is an object of the present disclosure to provide, while taking the above points into account, an electronic device that may prevent a short circuit between an electrical conductor of an electronic component and a heat sink, and provide a drive device that includes the electronic device.

In a first aspect of the present disclosure, an electronic device includes a substrate, an electronic component which is mounted on the substrate and includes a chip, an electrical conductor electrically connected to the chip, and an insulator portion that molds the chip with the electrical conductor, an insulating and heat dissipating material disposed on a side of the electronic component opposite from the substrate, and a heat sink that includes a non-abutting surface and an abutting surface. The heat sink is configured to absorb heat which is generated from the electronic component when the electronic component is energized, the non-abutting surface faces the electrical conductor, which is exposed at the side of the electronic component opposite from the substrate, such that the insulating and heat dissipating material is interposed between the non-abutting surface and the electrical conductor, and the abutting surface is positioned closer toward the substrate than the non-abutting surface is and configured to be abuttable with the insulator portion.

Accordingly, for the heat sink, the abutting surface is positioned closer toward the substrate than the non-abutting surface is. For this reason, when the abutting surface of the heat sink abuts the insulator portion of the electronic component, the non-abutting surface of the heat sink is prevented from abutting the electrical conductor of the electronic component. Accordingly, even if the substrate is warped toward the heat sink due to temperature changes or the like, or if the electronic device is assembled with the abutting surface of the heat sink abutting the insulator portion of the electronic component, the electronic device may prevent a short circuit between the non-abutting surface of the heat sink and the electrical conductor of the electronic component.

In a second aspect of the present disclosure, a drive device includes the electronic device. The drive device includes a motor unit and a controller, the motor unit outputting a steering assist torque for an electric power steering device, and the controller driving the motor unit. The electronic device is used in the controller.

Accordingly, in the second aspect, malfunctions in the drive device due to a short circuit between the electronic component and the heat sink may be prevented. Further, in the second aspect, by improving heat dissipation from the electronic component to the heat sink, a high electrical current may be provided to the controller and the motor unit so that the steering assist torque output from the drive device may be increased. Moreover, in the second aspect, the physical size of the controller may be suitably miniaturized by reducing the insulation gap between the electronic component and the heat sink.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
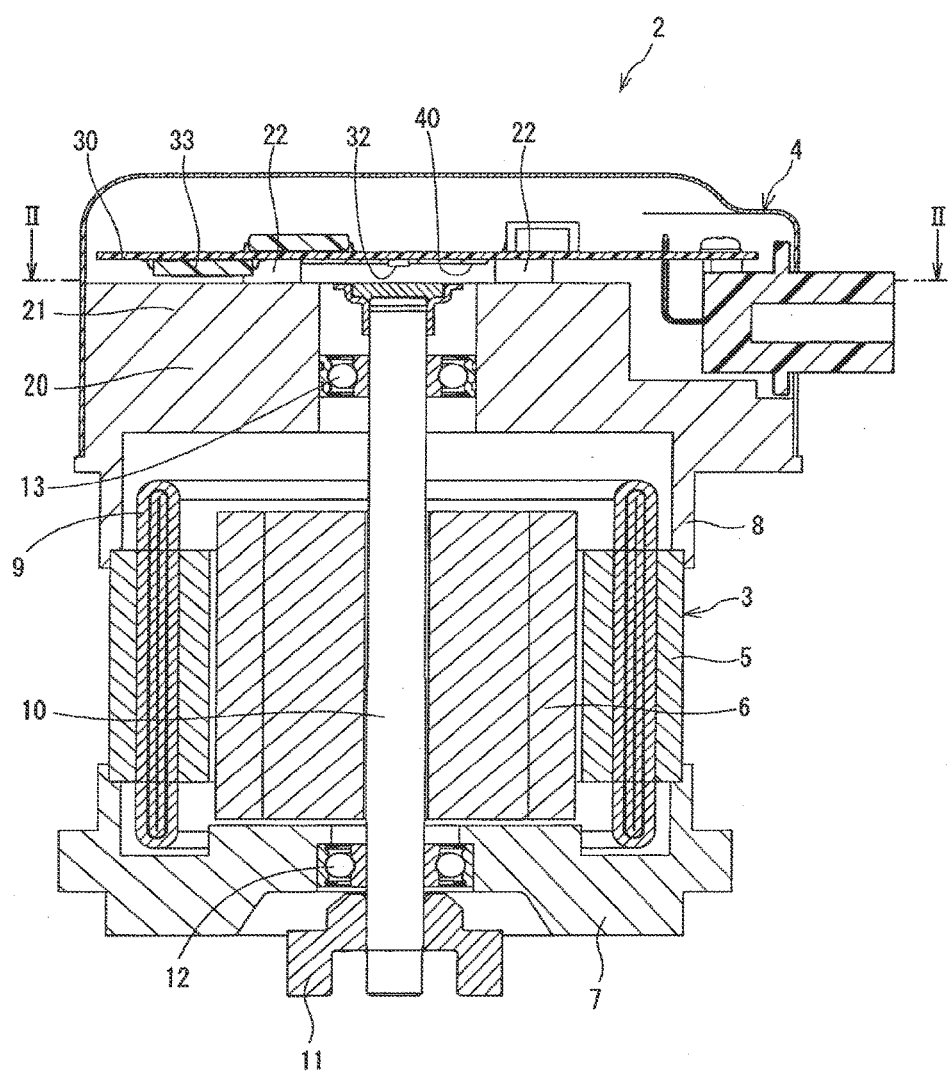
FIG. 1 is a cross-section view of a drive device for an electric power steering device that uses an electronic device according to a first embodiment of the present disclosure.

Hereinafter, an electronic device according to a plurality of embodiments of the present disclosure, as well as a drive device including the electronic device, will be explained with reference to the figures. Further, in the plurality of embodiments, substantially identical configurations will be denoted with the same reference numeral(s), and explanations thereof may be omitted for brevity.

First Embodiment

A first embodiment of the present disclosure is shown in FIGS. 1 to 6. An electronic device 1 according to the first embodiment is used in a drive device 2. The drive device 2 generates steering assist torque for an electric power steering device of a vehicle.

First, the configuration of the drive device 2 will be explained, and the electronic device 1 will be explained thereafter.

As shown in FIG. 1, the drive device 2 includes a motor unit 3 and a controller 4 that drives the motor unit 3.

The motor unit 3 includes a stator 5 and a rotor 6. The stator 5 is formed in a cylinder shape. One end of the stator 5 in an axial direction is supported by a front frame end 7, and the other end of the stator 5 is supported by a rear frame end 8. A coil 9 is wound in a slot of the stator 5. The rotor 6 is formed in a cylinder shape on an inner side of the stator 5 in a radial direction. Here, the rotor 6 is disposed so as to be rotatable with respect to the stator 5. Further, the rotor 6 has a shaft 10. An output end 11 of the shaft 10 is rotatably supported by a bearing 12 provided in the front frame end 7. The other end of the shaft 10 is rotatably supported by a bearing 13 provided in the rear frame end 8.

In the motor unit 3, when the controller 4 energizes the coil 9, the stator 5 generates a rotating magnetic field, and the rotor 6 and the shaft 10 axially rotate.

Figure 2:
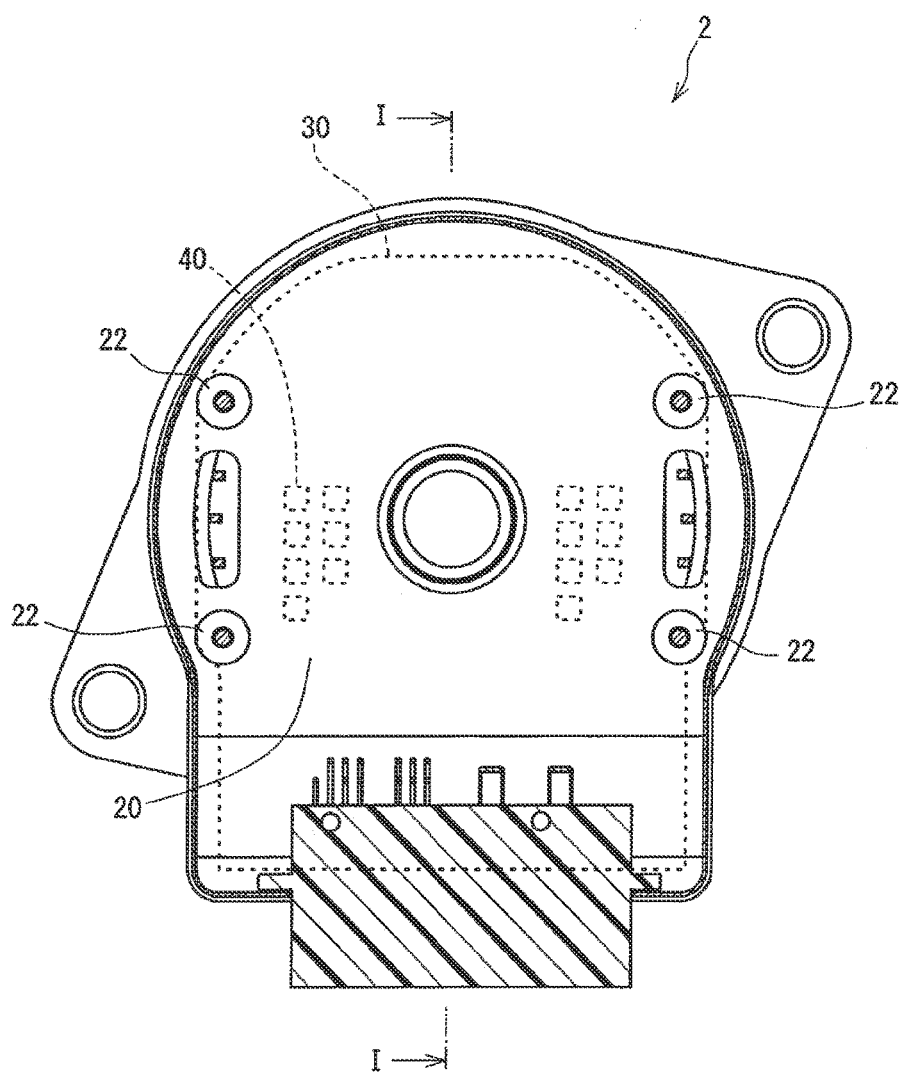
FIG. 2 is a cross-section view along the II-II line of FIG. 1.

As shown in FIGS. 1 and 2, the controller 4 includes a heat sink 20 and a substrate 30. The heat sink 20 is integrally formed with the rear frame end 8. The substrate 30 is disposed on a side of the heat sink 20 opposite from the motor unit 3. In the present embodiment, the controller 4 is formed from the electronic device 1, which includes the heat sink 20, the substrate 30, an electronic component 40, and the like.

In the present embodiment, the electronic device 1 includes only one sheet of the substrate 30.

A plurality of the electronic component 40 is mounted on the substrate 30. Accordingly, as compared to a case where the controller 4 includes a plurality of substrates, it is possible to reduce the number of components and miniaturize the controller 4.

In FIG. 2, one example of the substrate 30 and the electronic components 40 mounted on a side of the substrate 30 facing the heat sink 20 is shown with dashed lines.

Figure 3:
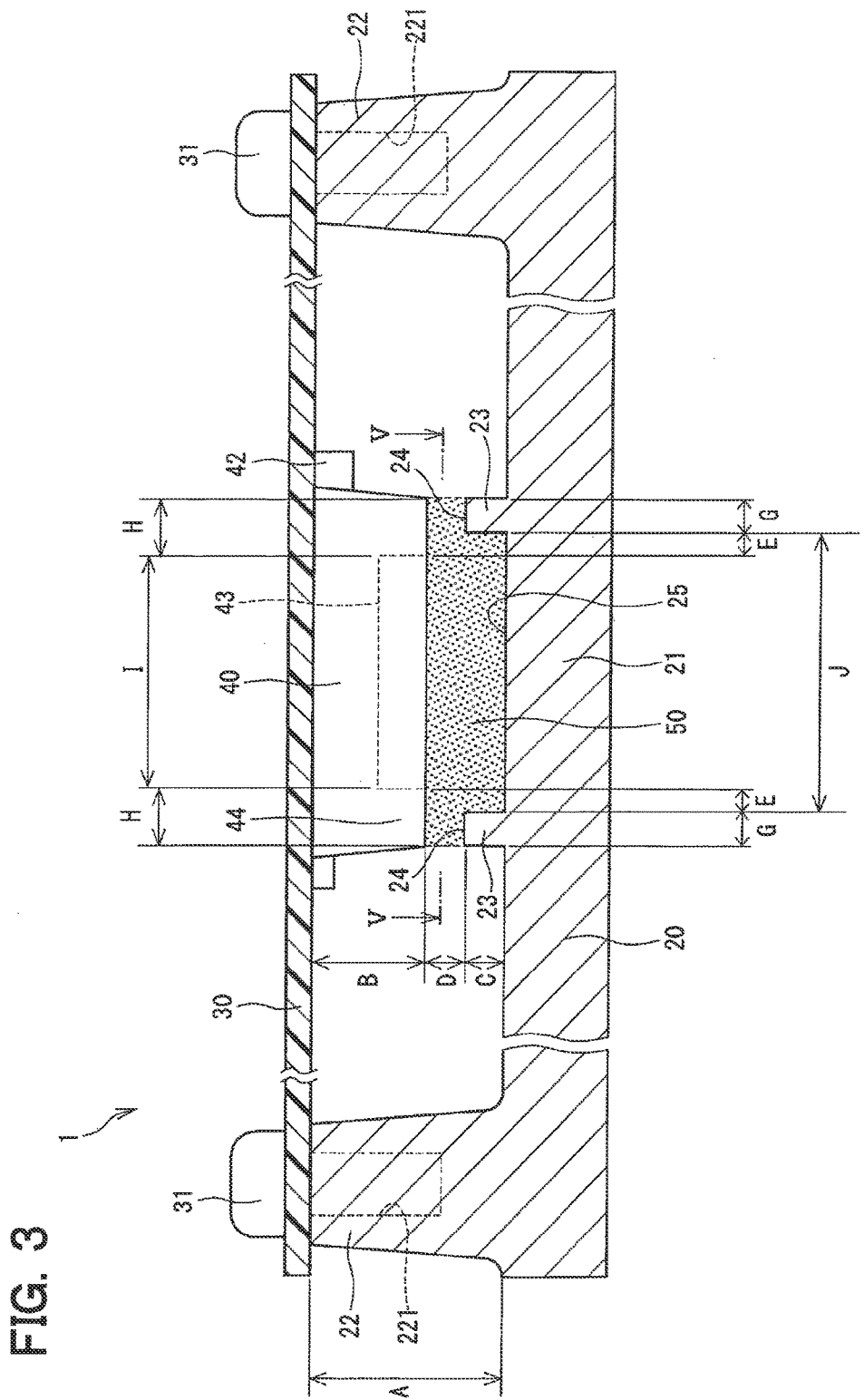
FIG. 3 is a schematic cross-section view of the electronic device according to the first embodiment of the present disclosure.

As shown in FIGS. 1 to 3, the heat sink 20 is integrally formed from a heat sink body 21, a support portion 22, and a plurality of protruding portions 23. The heat sink body 21 extends from the rear frame end 8 and toward the substrate 30. The support portion 22 is disposed at an outer periphery of this heat sink body 21. The plurality of protruding portions 23 are described later. The heat sink 20 may be aluminum, and is formed by casting, machining, or the like. The heat sink 20 absorbs heat which is generated when the electronic components 40 (described later) are energized.

The substrate 30 may be a multilayer printed circuit board, and is fixed to the heat sink 20. Specifically, four screws 31 are used to screw the substrate 30 to screw holes 221 formed in the support portion 22 of the heat sink 20.

The electronic components 40, a sensor 32, and an integrated circuit 33 are mounted on the side of the substrate 30 facing the heat sink 20. The electronic components 40 include switching elements such as MOSFETs. The sensor 32 detects a position of the rotor 6. Further, the integrated circuit 33 controls electric power provided to the coil 9 based on the position of the rotor 6.

The plurality of MOSFETs mounted on the substrate 30 function as a three-phase inverter circuit for providing electric power to the motor unit 3. Further, the plurality of MOSFETs function as a power switch that can disconnect electric power supplied from a connector to the three-phase inverter circuit. The three-phase inverter circuit provides the electric power to the coil 9 of the motor unit 3 based on instructions from a microprocessor.

Heat dissipating gel 50 (which may be referred to as "heat dissipating grease"), which functions as an insulating and heat dissipating material, is applied between the electronic components 40 and the heat sink 20 (see FIG. 3). The heat dissipating gel 50 is formed from a heat conductive material, and may be, for example, a primarily silicone gel. The heat dissipating gel 50 prevents a layer of air from interposing between the electronic components 40 and the heat sink 20. Accordingly, thermal conductivity between the electronic components 40 and the heat sink 20 is increased.

In the present embodiment, the substrate 30, the electronic components 40, the heat dissipating gel 50, and the heat sink 20 collectively act as an example of an "electronic device 1".

Figure 4:
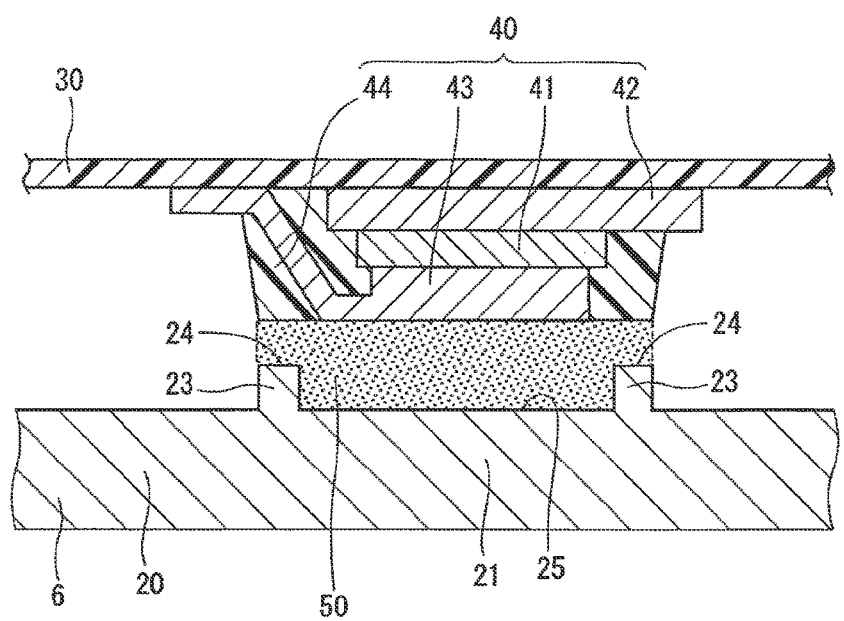
FIG. 4 is a schematic cross-section view of the electronic device according to the first embodiment of the present disclosure.
Figure 5:
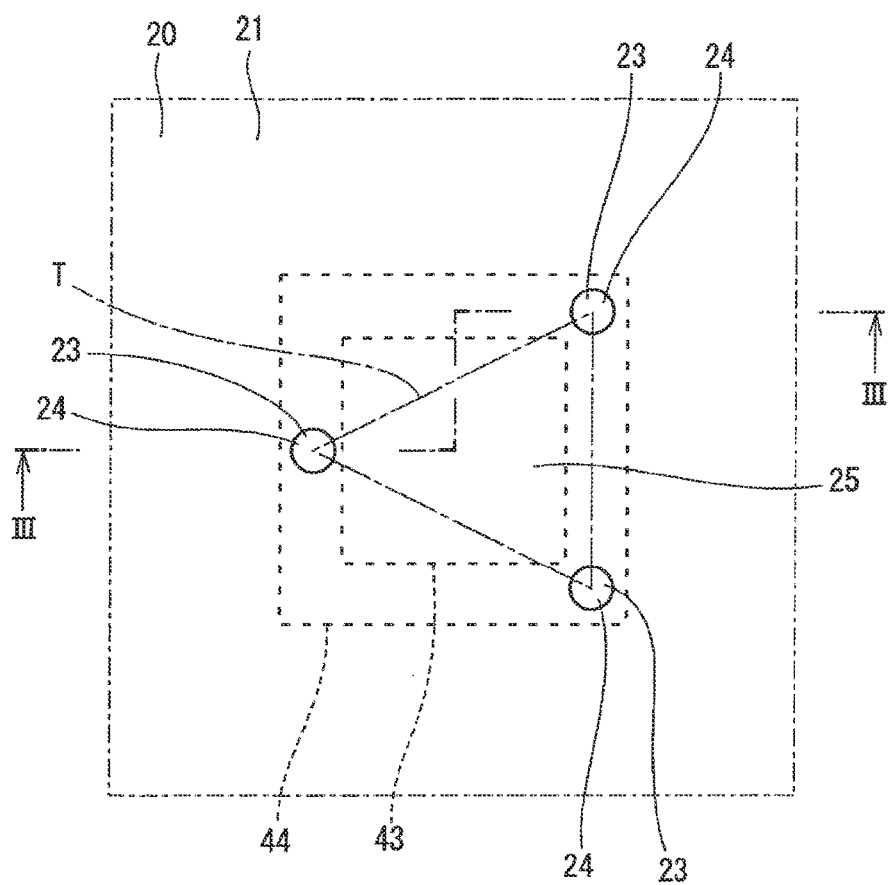
FIG. 5 is a schematic plane view of a heat sink along the cross section of the V-V line in FIG. 3.

FIGS. 3 to 5 schematically show the electronic device 1 used in the controller 4.

This electronic device 1 includes MOSFETs, which are one example of the electronic components 40. As shown in FIG. 4, the electronic components 40 includes a chip 41, electrical conductors 42, 43, and an insulator portion 44. The electrical conductors 42, 43 are electrically connected to the chip 41. Further, the insulator portion 44 resin molds the chip 41 with the electrical conductors 42, 43. The chip 41, which includes the MOSFETs, is formed from P type and N type semiconductor elements where a control signal is input to a gate, and in response, turns on and off current flow between a source and a drain.

The electrical conductors 42, 43 include a substrate side electrical conductor 42 and a rear side electrical conductor 43. The substrate side electrical conductor 42 is connected to wiring of the substrate 30. The rear side electrical conductor 43 is exposed from the insulator portion 44 on a side of the electronic components 40 opposite from the substrate 30. In the present embodiment, the substrate side electrical conductor 42 is a drain terminal, and the rear side electrical conductor 43 is a source terminal. The rear side electrical conductor 43 preferably transfers heat generated from the chip 41 to the heat sink 20 through the heat dissipating gel 50.

The insulator portion 44 integrally resin molds the chip 41, the substrate side electrical conductor 42, and the rear side electrical conductor 43 together. In FIGS. 3 and 4, an end face of the insulator portion 44 facing the heat sink 20 and a end face of the rear side electrical conductor 43 facing the heat sink 20 are coplanar. However, these end faces may be at different heights as well.

Further, where appropriate, the rear side electrical conductor 43 will hereinafter be referred to as "the electrical conductor 43".

The heat sink 20 is integrally formed from the heat sink body 21, the plurality of protruding portions 23, and the support portion 22. The plurality of protruding portions 23 protrude from the heat sink body 21 and toward the substrate 30. The support portion 22 protrudes from the heat sink body 21 and toward the substrate 30, and supports the substrate 30.

The protruding portions 23 are disposed so that the protruding portions 23 and the insulator portion 44 of the electronic components 40 face each other. In FIG. 5, the outlines of the electrical conductor 43 and the insulator portion 44 of the electronic components 40 are shown with dashed lines. As shown in FIG. 5, in the present embodiment, three of the protruding portions 23 of the heat sink 20 are provided for the insulator portion 44 of one of the electronic components 40. The three protruding portions 23 are not positioned single file in a straight line. Rather, an imaginary line T that connects the three protruding portions 23 forms a triangular shape.

Further, the heat sink 20 is not limited to having three protruding portion 23, and may have one or more protruding portions 23. In addition, the positions and shape of the protruding portions 23 may be arbitrarily set.

As shown in FIG. 3, a height A of the support portion 22 is greater than the sum of a height B of the electronic components 40 and a height C of the protruding portions 23. Further, the substrate 30 is fixed by the screws 31 to the end face of the support portion 22. In this case, the substrate 30 and the electronic components 40 are substantially parallel with respect to the heat sink body 21. Accordingly, a gap D is formed between the electronic components 40 and the protruding portions 23. As a result, the protruding portions 23 are prevented from applying stress on the electronic components 40.

Figure 6:
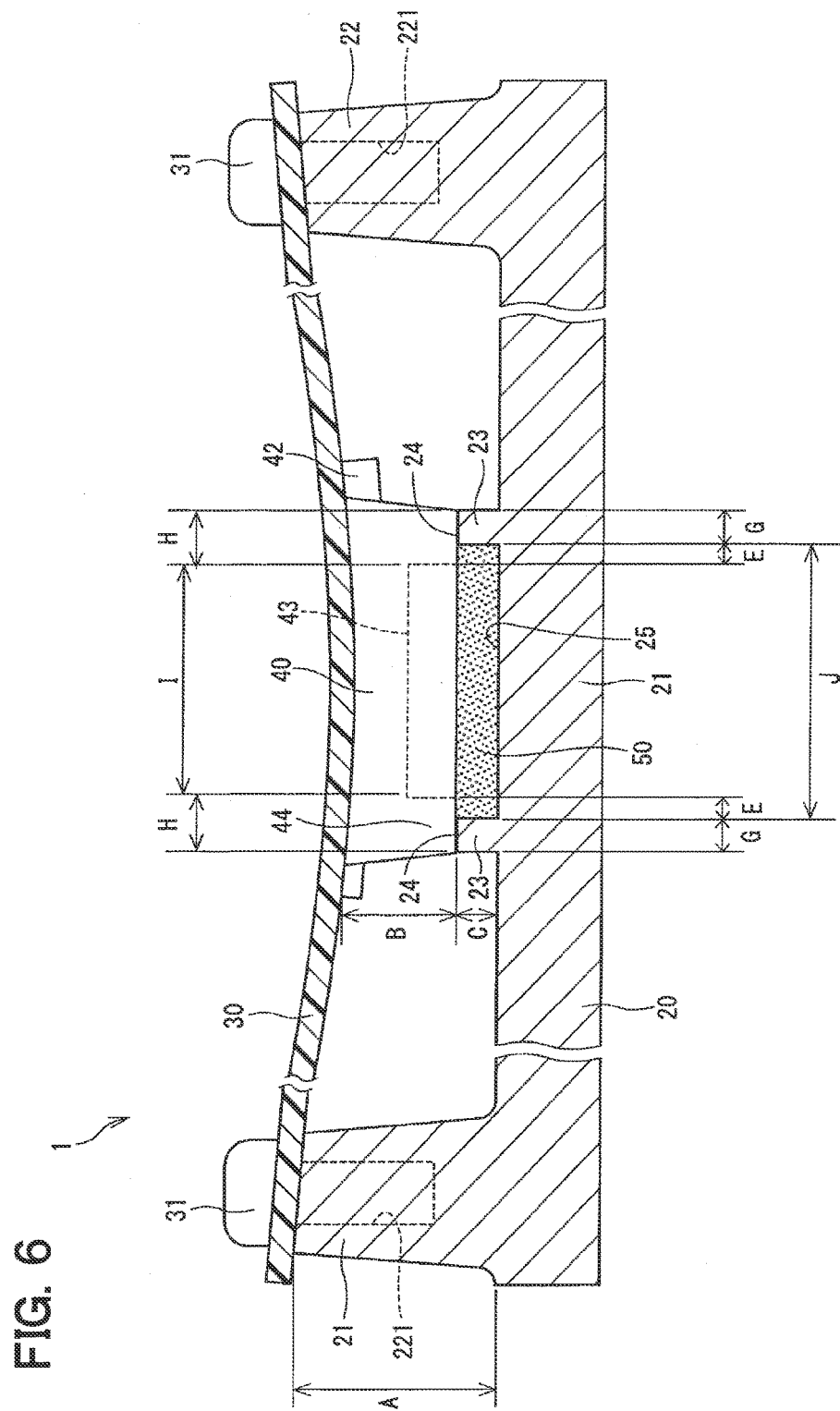
FIG. 6 is a schematic cross-section view showing a substrate, which is in a warped state, of the electronic device according to the first embodiment.

In FIG. 6, the substrate 30 is shown as being warped toward the heat sink 20 due to temperature changes. In this situation, there is a possibility of the surfaces of the protruding portions 23 facing the insulator portion 44 abutting the insulator portion 44 of the electronic components 40. In this case, the surfaces of the protruding portions 23 facing the insulator portion 44 are referred to as abutting surfaces 24. The abutting surfaces 24 are configured to be abuttable with the insulator portion 44.

Conversely, the heat sink body 21 is spaced from the electrical conductor 43 by a predetermined distance. The heat dissipating gel 50 fills this space. In this case, the surface of a region of the heat sink body 21 that faces the electrical conductor 43 with the heat dissipating gel 50 interposed therebetween is referred to as a non-abutting surface 25. The non-abutting surface 25 does not abut the electrical conductor 43.

As shown in FIGS. 3 and 6, the abutting surfaces 24 are positioned closer toward the substrate 30 than the non-abutting surface 25 is by the height C of the protruding portions 23. The height C of the protruding portions 23 is set such that when the abutting surfaces 24 abut the insulator portion 44, a space is formed between the non-abutting surface 25 and the electrical conductor 43 in which the insulator property of the heat dissipating gel 50 may be ensured.

Further, as shown in FIGS. 3 and 6, the abutting surfaces 24 are disposed outward of the electrical conductor 43. A distance J between respective abutting surfaces 24 is greater than a width I of the electrical conductor 43. Further, a width G of the abutting surfaces 24 is less than a width H of the surface of the region of the insulator portion 44 that faces the heat sink 20. Accordingly, the abutting surfaces 24 are disposed at locations which face the insulator portion 44 and which do not face the electrical conductor 43.

Further, in a direction substantially parallel with the substrate 30, a distance E between the abutting surfaces 24 and the electrical conductor 43 is set such that even if the abutting surfaces 24 abut the insulator portion 44, a space is formed wherein the heat dissipating gel 50 maintains the insulation between the abutting surfaces 24 and the electrical conductor 43. Accordingly, in the electronic device 1, a short circuit between the electronic components 40 and the heat sink 20 may be prevented.

The first embodiment exhibits at least the following effects.

In the first embodiment, the heat sink 20 of the electronic device 1 includes a non-abutting surface 25 and abutting surfaces 24. The non-abutting surface 25 faces the electrical conductor 43 of the electronic components 40. The abutting surfaces 24 are positioned closer toward the substrate 30 than the non-abutting surface 25 is, and are abuttable the insulator portion 44 of the electronic components 40.

As a result, in the event that the insulator portion 44 of the electronic components 40 abuts the abutting surfaces 24 of the heat sink 20, the electrical conductor 43 of the electronic components 40 is prevented from abutting the non-abutting surface 25 of the heat sink 20. Accordingly, in the electronic device 1, even if the substrate 30 is warped toward the heat sink 20 due to, for example, changes in temperature, a short circuit between the electronic components 40 and the heat sink 20 may be prevented.

Further, in the electronic device 1 of the first embodiment, the height C of the protruding portions 23 of the heat sink 20 may be set to the smallest value that ensures that the electrical conductor 43 of the electronic components is insulated from the non-abutting surface 25 of the heat sink 20. By doing so, the physical size of the electronic device 1 is preferably miniaturized.

Further, in the electronic device 1 of the first embodiment, by setting the height C of the protruding portions 23 of the heat sink 20 to be low, it is possible to improve heat dissipation from the electronic components 40 to the heat sink 20. Moreover, in the electronic device 1, it is possible to reduce the amount of the heat dissipating gel 50 applied in the space between the electrical conductor 43 of the electronic components 40 and the non-abutting surface 25 of the heat sink 20.

Further, when manufacturing the electronic device 1 of the first embodiment, there is less need to strictly control various aspects of the electronic device 1, including the tolerance of the heights of the electronic components 40 mounted on the substrate 30, the height of solder used to mount the electronic components 40 on the substrate 30, and warping of the substrate 30. Accordingly, the electronic device 1 is advantageous in that manufacturing costs may be reduced.

In the electronic device 1 of the first embodiment, even if the abutting surfaces 24 of the heat sink 20 abuts the insulator portion 44 of the electronic components 40, the heat dissipating gel 50 fills an insulating space C formed between the non-abutting surface 25 and the electrical conductor 43.

As a result, in the electronic device 1, insulation between the electrical conductor 43 and the non-abutting surface 25 may be ensured.

In the electronic device 1 of the first embodiment, the abutting surfaces 24 are disposed at locations which face the insulator portion 44 and which do not face the electrical conductor 43.

As a result, even if the abutting surfaces 24 of the heat sink 20 abut the insulator portion 44 of the electronic components 40, the abutting surfaces 24 do not contact the electrical conductor 43. Accordingly, in the electronic device 1, insulation between the electrical conductor 43 and the non-abutting surface 25 may be ensured.

In the electronic device 1 of the first embodiment, even if the abutting surfaces 24 of the heat sink 20 abut the insulator portion 44 of the electronic components 40, in a direction substantially parallel with the substrate 30, the heat dissipating gel 50 fills an insulating space E formed between the abutting surfaces 24 and the electrical conductor 43.

As a result, in the electronic device 1, insulation between the electrical conductor 43 and the non-abutting surface 25 may be ensured.

In the first embodiment, the heat sink 20 of the electronic device 1 integrally includes the heat sink body 21 and the protruding portions 23, the protruding portions 23 protruding from the heat sink body 21 and toward the substrate 30.

As a result, the protruding portions 23 may be easily formed on the heat sink 20 by, for example, casting. Accordingly, manufacturing costs of the electronic device 1 may be reduced.

In the first embodiment, the heat sink 20 of the electronic device 1 integrally includes the heat sink body 21, the protruding portions 23, and the support portion 22, the support portion 22 protruding from the heat sink body 21 and toward the substrate 30 to support the substrate 30.

As a result, in the electronic device 1, the tolerance of the difference between the height A of the support portion 22 and the height C of the protruding portions 23 may be minimized.

In the first embodiment, the heat sink 20 of the electronic device 1 includes three protruding portions 23 for one of the electronic components 40, and is configured to suppress tilting of the electronic components 40.

As a result, a short circuit between the electrical conductor 43 of the electronic components 40 and the non-abutting surface 25 of the heat sink 20 may be reliably prevented. Further, the number of protruding portions 23 may also be three or more.

The electronic device 1 of the first embodiment is used in the controller 4 for the drive device 2. This controller 4 drives the motor unit 3 which outputs a steering assist torque for an electric power steering device.

As a result, the controller 4 of the drive device 2 may prevent malfunctions in the drive device 2 due to a short circuit between the electronic components 40 and the heat sink 20. Further, in the controller 4, by improving heat dissipation from the electronic components 40 to the heat sink 20, a high electric current may be provided to the motor unit 3 so that the steering assist torque output from the drive device 2 may be increased. Further, the physical size of the controller 4 maybe miniaturized by reducing the insulation gap between the electronic components 40 and the heat sink 20.

Second Embodiment

Figure 7:
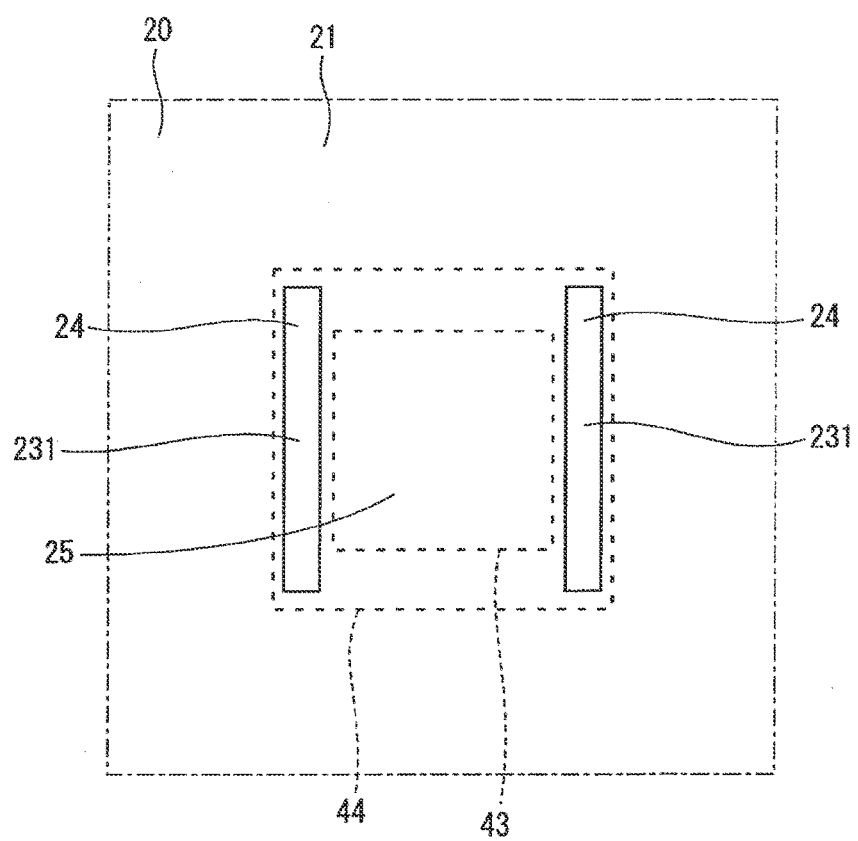
FIG. 7 is a schematic plane view a heat sink of an electronic device according to a second embodiment of the present disclosure.

FIG. 7 is a schematic plane view showing the heat sink 20 included in the electronic device 1 of a second embodiment of the present disclosure. Further, in FIGS. 7 to 9 as well, the outlines of the electrical conductor 43 and the insulator portion 44 included in the electronic components 40 are shown with dashed lines.

In the second embodiment, the heat sink 20 includes protruding portions 231. The protruding portions 231, when viewed along the thickness direction of the substrate 30, are shaped as straight lines that allow continuously abutting with the insulator portion 44 of the electronic components 40. Further, two of these protruding portions 231 are provided for one of the electronic components 40. The two protruding portions 231 are arranged in parallel. As a result, the protruding portions 231 suppress tilting of the electronic components 40. Further, it is sufficient that at least one of the protruding portions 231 is provided, and the shapes and positions thereof may be arbitrarily configured.

According to the above configuration, in the second embodiment, a short circuit between the electrical conductor 43 of the electronic components and the non-abutting surface 25 of the heat sink 20 may be reliably prevented.

Further, in the second embodiment, by increasing the volume of the protruding portions 231 of the heat sink 20, heat dissipation by the electronic components 40 may be improved.

Third Embodiment

Figure 8:
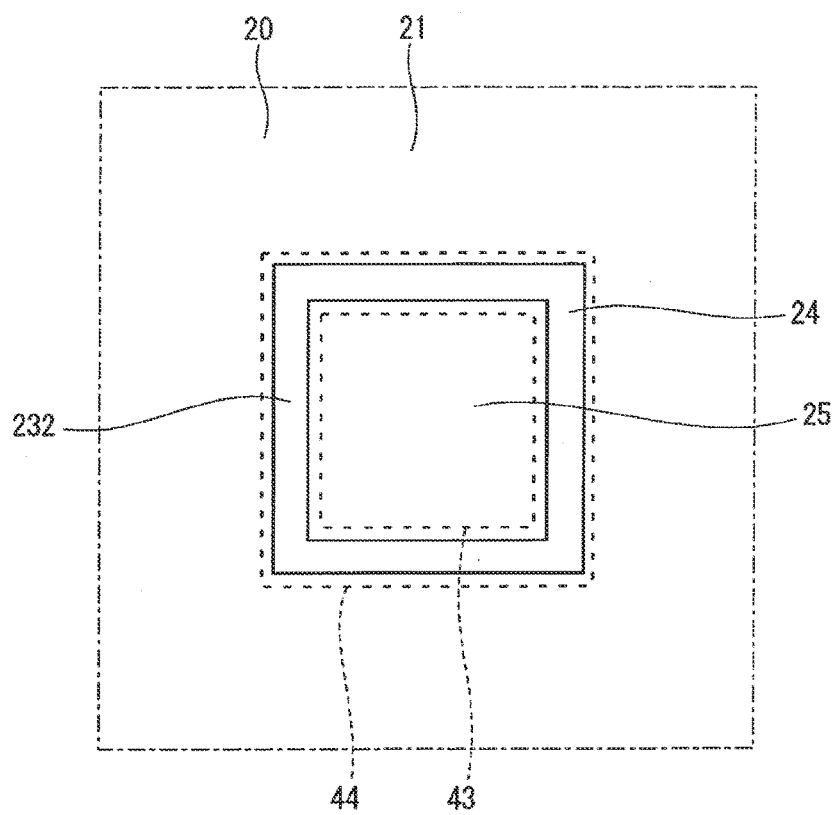
FIG. 8 is a schematic plane view a heat sink of an electronic device according to a third embodiment of the present disclosure.

FIG. 8 is a schematic plane view showing the heat sink 20 included in the electronic device 1 of a third embodiment of the present disclosure.

In the third embodiment, the heat sink 20 includes a protruding portion 232. The protruding portion 232, when viewed along the thickness direction of the substrate 30, has a rectangular shape that allows continuously abutting with the insulator portion 44 of the electronic components 40. As a result, the protruding portion 232 suppresses tilting of the electronic components 40.

The third embodiment may also exhibit at least the same effects as the first and second embodiments described above.

Fourth Embodiment

Figure 9:
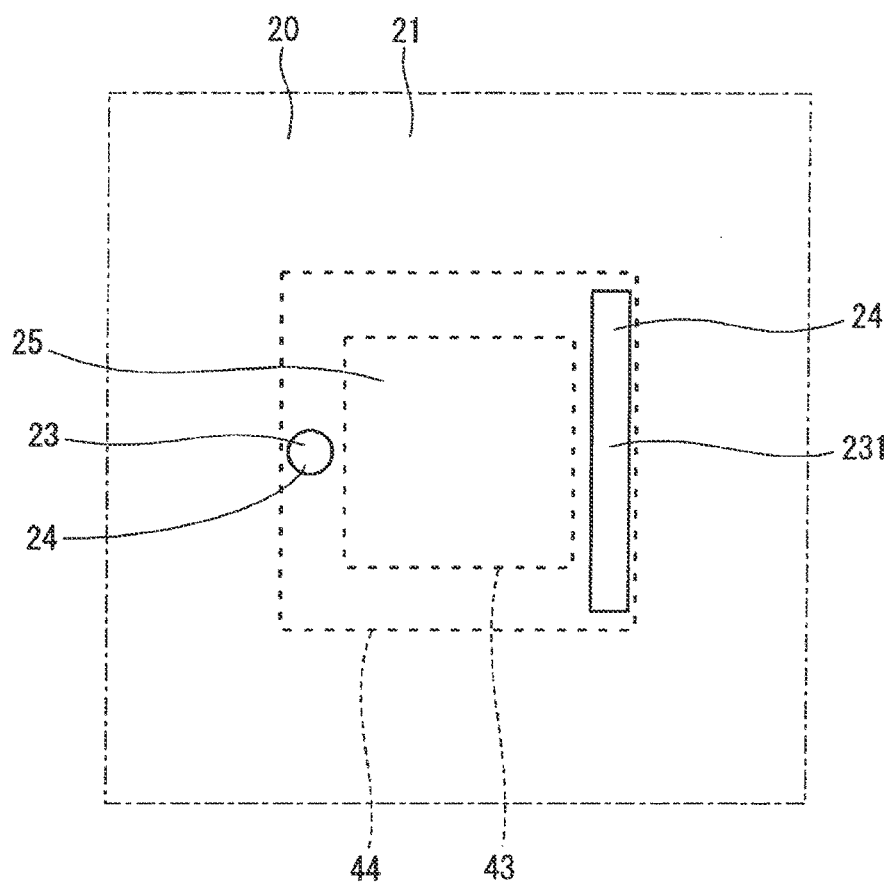
FIG. 9 is a schematic plane view a heat sink of an electronic device according to a fourth embodiment of the present disclosure.

FIG. 9 is a schematic plane view showing the heat sink 20 included in the electronic device 1 of a fourth embodiment of the present disclosure.

The fourth embodiment is a combination of the first and second embodiments. When viewed along the thickness direction of the substrate 30, the heat sink 20 includes a cylindrical shaped protruding portion 23, and a protruding portion 231 having a straight line shape that allows continuously abutting with the insulator portion 44 of the electronic components 40.

The third embodiment may also exhibit at least the same effects as the first, second, and third embodiments described above.

Fifth Embodiment

Figure 10:
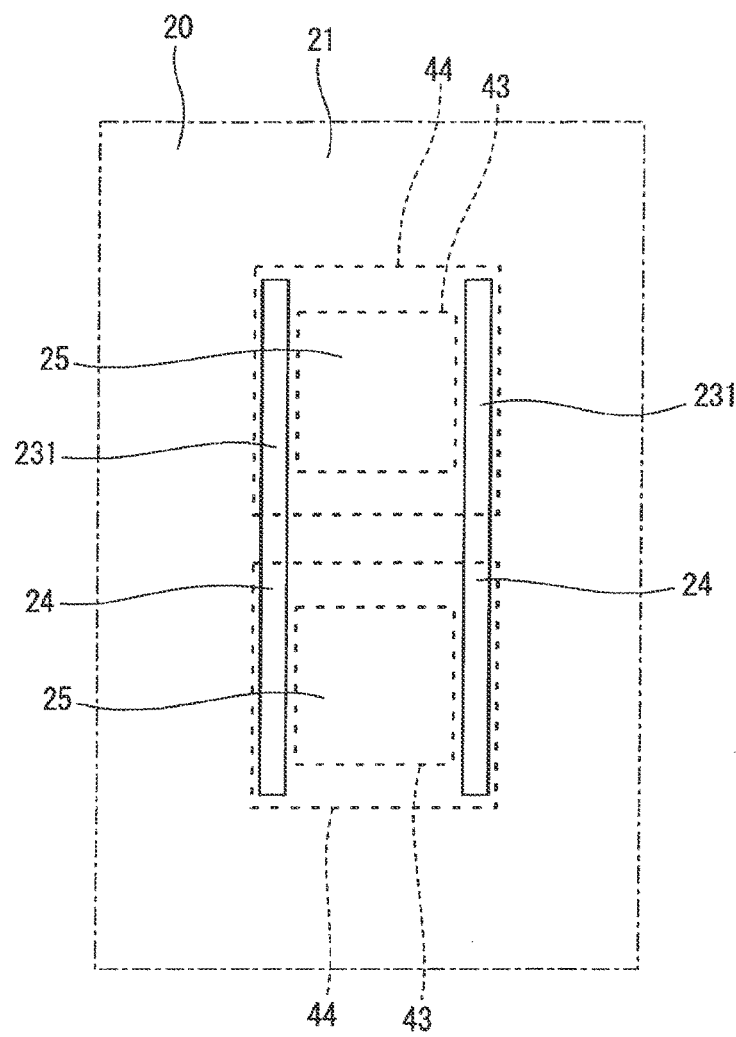
FIG. 10 is a schematic plane view a heat sink of an electronic device according to a fifth embodiment of the present disclosure.

FIG. 10 is a schematic plane view showing the heat sink 20 included in the electronic device 1 of a fifth embodiment of the present disclosure.

In the fifth embodiment, the heat sink 20 includes protruding portions 231 where each, when viewed along the thickness direction of the substrate 30, is shaped as a straight line that allows continuously abutting with a plurality of insulator portions 44 of the electronic components 40. As a result, a fewer number of the protruding portions 231 may be provided on the heat sink 20.

Sixth Embodiment

Figure 11:
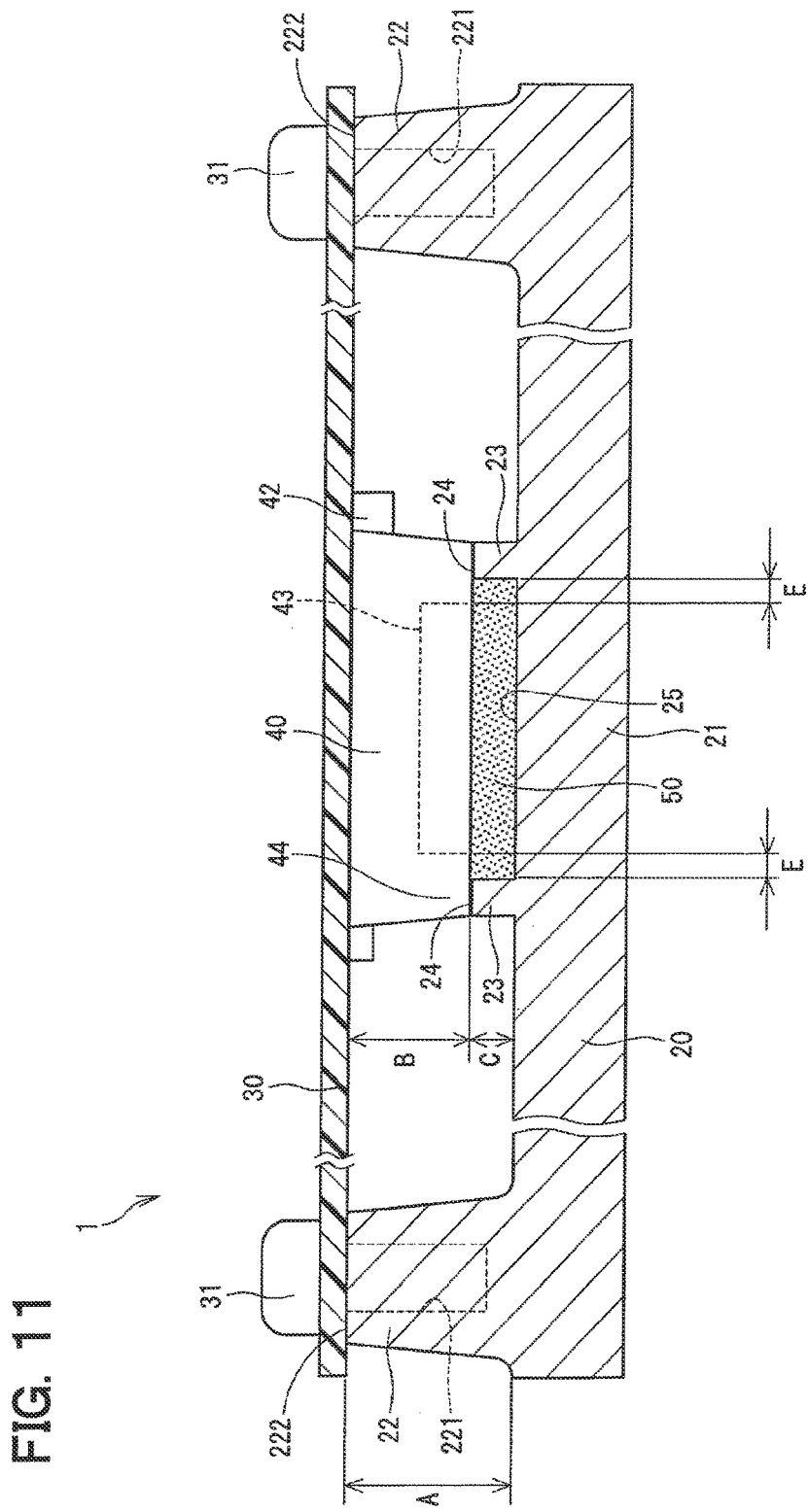
FIG. 11 is a schematic cross-section view of an electronic device according to a sixth embodiment of the present disclosure.

FIG. 11 is a schematic cross-section view of the electronic device 1 according to a sixth embodiment of the present disclosure.

In the sixth embodiment, the height A of the support portion 22 included in the heat sink 20 is substantially equal to the sum of the height B of the electronic components 40 and the height C of the protruding portions 23. Accordingly, when the screws 31 are used to fix the substrate 30 to an end surface 222 of the support portions 22, the insulator portion 44 of the electronic components 40 abuts the abutting surfaces 24 of the protruding portions 23.

In this configuration as well, a space equal in distance to the height C of the protruding portions 23 is defined between the electrical conductor 43 of the electronic components 40 and the non-abutting surface 25 of the heat sink body 21. The heat dissipating gel 50 fills this space. Accordingly, for the electronic device 1 of the sixth embodiment, the electronic device 1 is assembled with the abutting portion of the heat sink 20 abutting the electronic components 40. Even in this case, a short circuit between the electronic components 40 and the heat sink 20 may be prevented.

Seventh Embodiment

Figure 12:
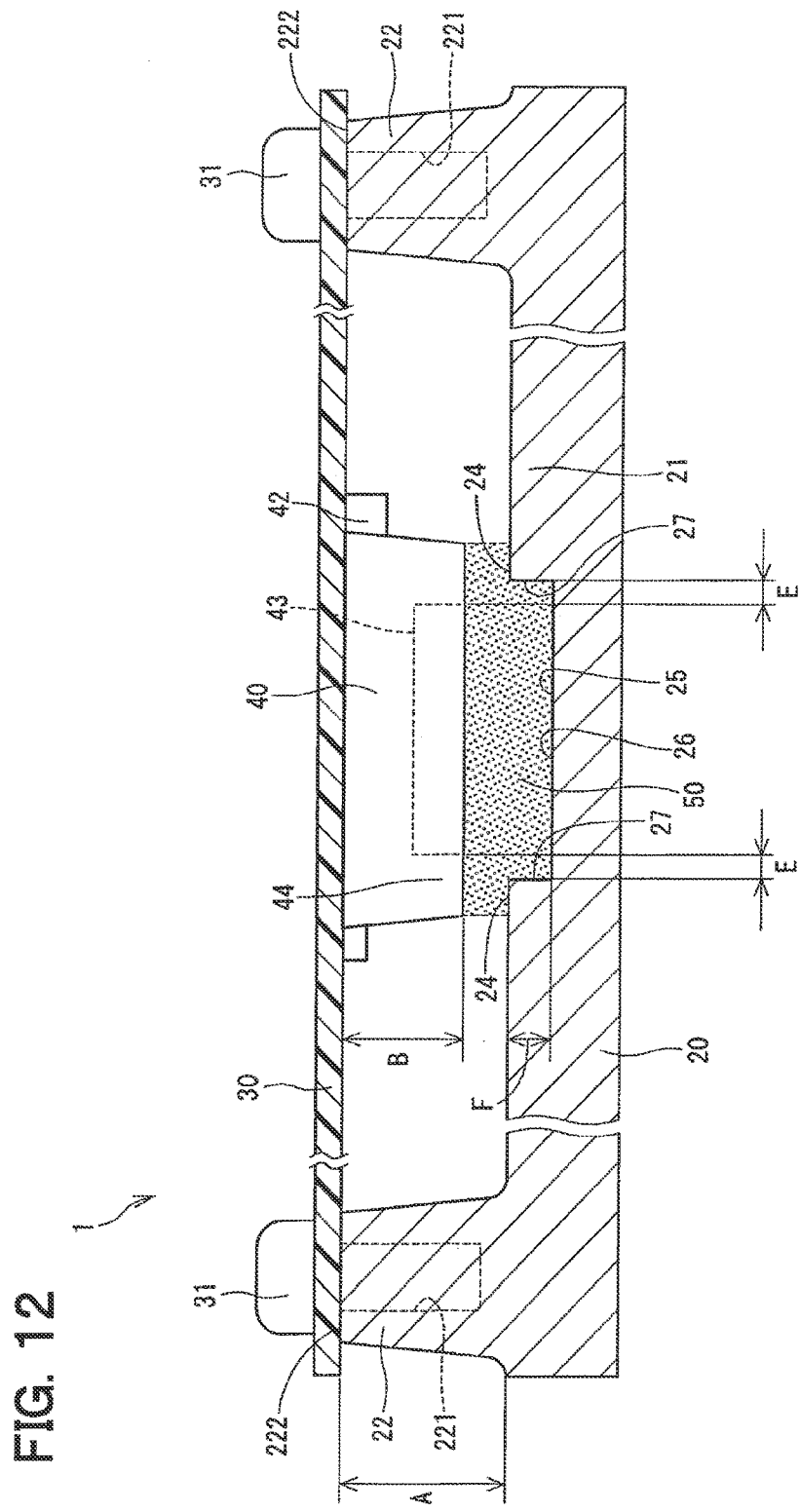
FIG. 12 is a schematic cross-section view of an electronic device according to a seventh embodiment of the present disclosure.
Figure 13:
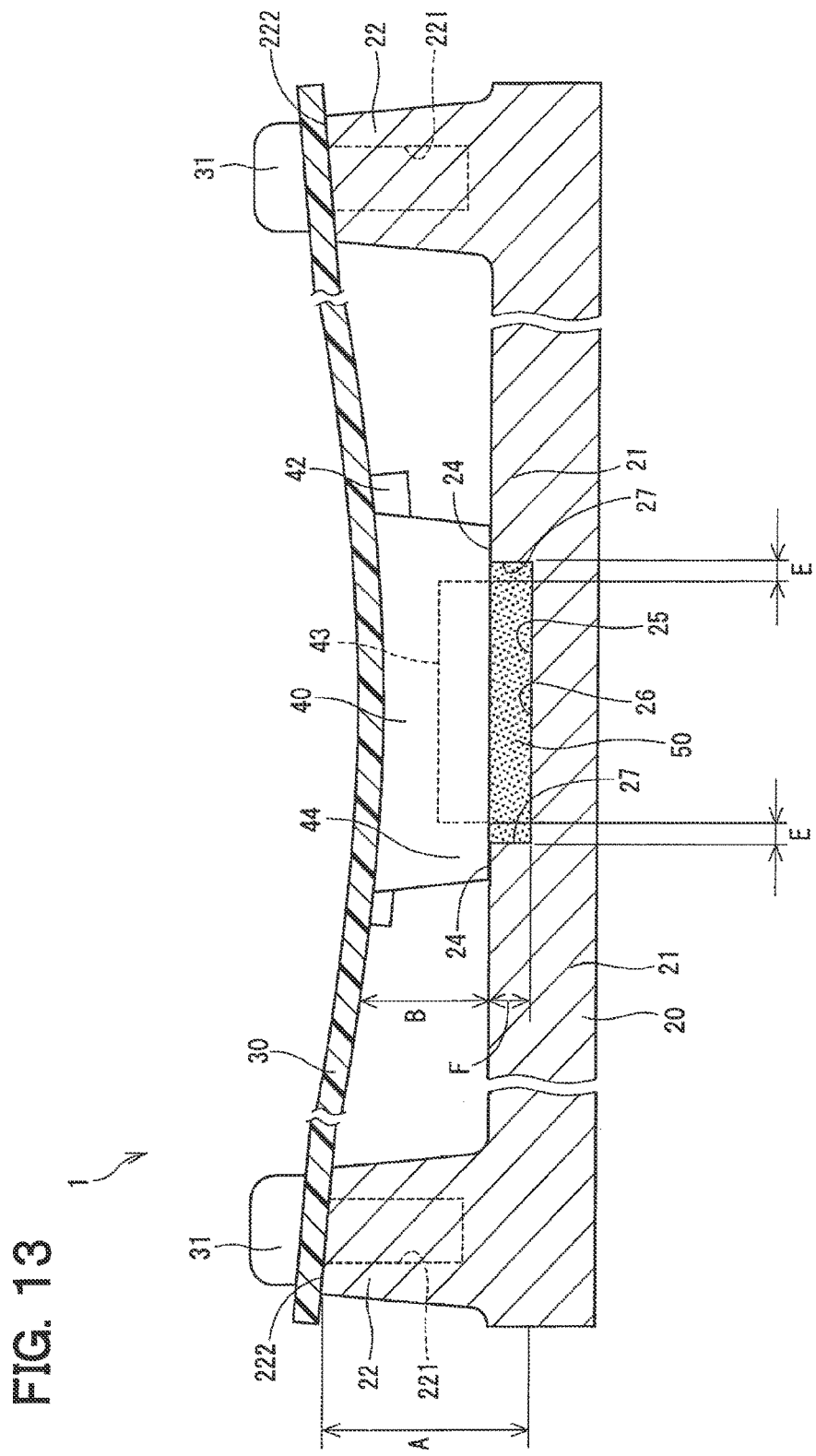
FIG. 13 is a schematic cross-section view showing a substrate, which is in a warped state, of the electronic device according to the seventh embodiment.

FIGS. 12 and 13 are schematic cross-section views of the electronic device 1 according to a seventh embodiment of the present disclosure.

In the seventh embodiment, the heat sink 20 includes a recessed portion 26 that is indented from the heat sink body 21 and away from the substrate 30. The recessed portion 26 is formed at a location facing the electrical conductor 43 of the electronic components 40. An outer edge 27 of the recessed portion 26 is positioned outward of an outer edge of the electrical conductor 43 of the electronic components 40.

In FIG. 13, the substrate 30 is shown as being warped toward the heat sink 20 due to, e.g., temperature changes or the like. In this state, the surface of a region of the heat sink body 21 which faces the insulator portion 44 is abuttable with the insulator portion 44 of the electronic components 40. In other words, in the seventh embodiment, the surface of the region of the heat sink body 21 surface which faces the insulator portion 44, and which is abuttable with the insulator portion 44 of the electronic components 40, constitutes the abutting surfaces 24.

Conversely, the inner surface of the recessed portion 26 of the heat sink 20 is spaced away from the electrical conductor 43 by a predetermined distance. The heat dissipating gel 50 fills this space. In other words, the inner surface of the recessed portion 26 of the heat sink 20 constitutes the non-abutting surface 25, which does not abut the electrical conductor 43.

As shown in FIGS. 12 and 13, the abutting surfaces 24 are positioned closer toward the substrate 30 than the non-abutting surface 25 is by a depth F of the recessed portion 26. The depth F of the recessed portion 26 is set such that if the abutting surfaces 24 abut the insulator portion 44, the heat dissipating gel 50 fills an insulating space formed between the non-abutting surface 25 and the electrical conductor 43. Further, in a direction substantially parallel with the substrate 30, a distance E is defined between the outer edge 27 of the recessed portion 26 and the electrical conductor 43. This distance E is set such that even if the abutting surfaces 24 abut the insulator portion 44, the heat dissipating gel 50 fills an insulating space formed between the outer edge 27 of the recessed portion 26 and the electrical conductor 43 in the direction substantially parallel with the substrate 30. Accordingly, in the electronic device 1, a short circuit between the electronic components 40 and the heat sink 20 may be prevented.

In the seventh embodiment, similar to embodiments one to six, the protruding portions 23 may be easily formed on the heat sink 20 by, e.g., casting or the like. Accordingly, the manufacturing cost of the electronic device 1 may be reduced.

Further, in the seventh embodiment, by increasing the volume of the heat sink body 21, the absorption amount of heat generated from the electronic components 40 may be increased.

Other Embodiments

The above embodiments are explained with respect to an electronic device 1 used in a controller 4 of a drive device 2. However, in other embodiments, the electronic device 1 is not limited to a controller 4 of a drive device 2, and may be applied to a variety of devices.

In the above embodiments, the electronic components 40 included in the electronic device 1 form a three-phase inverter circuit. However, in other embodiments, the electronic components 40 may form a variety of circuits, such as an H-bridge circuit or the like.

In the above embodiments, the electronic components 40 are described in one example as MOSFETs. However, in other embodiments, the electronic components 40 correspond to a variety of electronic components which release heat upon energizing, such as a microprocessor, an ASIC, a shunt resistor, an IGBT, a transistor, a thyristor, or the like. Further, in this case, the "chip" of the present disclosure corresponds to whichever portion that releases heat upon energizing.

Accordingly, the present disclosure is not limited to the embodiments described above, and includes a variety of modifications without deviating from the gist of the present disclosure.

The invention claimed is:
1. An electronic device, comprising:
   a substrate;
   an electronic component which is mounted on the substrate and includes a chip, an electrical conductor electrically connected to the chip, and an insulator portion that molds the chip with the electrical conductor;

an insulating and heat dissipating material disposed on a side of the electronic component opposite from the substrate; and a heat sink that includes a first surface, a second surface and a support portion, the support portion being formed away from the first surface and the second surface, and a distal end portion of the support portion being fixed to the substrate to space the electronic component away from the first surface and the second surface, wherein the heat sink is configured to absorb heat which is generated from the electronic component, the first surface faces the electrical conductor, which is exposed at the side of the electronic component opposite from the substrate, such that the insulating and heat dissipating material is interposed between the first surface and the electrical conductor, the second surface is positioned closer toward the substrate than the first surface, the second surface is positioned directly below the insulator portion to face the insulator portion and is spaced away from the insulator portion by a particular spacing, and no portion of the second surface is positioned immediately below the electronic conductor.

2. The electronic device of claim 1, wherein
warpage of the substrate toward the heat sink closes the particular spacing between the second surface and the insulator portion of the electronic component, in a thickness direction of the substrate, and the insulating and heat dissipating material fills an insulating space formed between the first surface and the electrical conductor.

3. The electronic device of claim 1, wherein
the second surface is provided at a location which faces the insulator portion and which does not face the electrical conductor.

4. The electronic device of claim 1, wherein
warpage of the substrate toward the heat sink closes the particular spacing between the second surface and the insulator portion of the electronic component, in a direction parallel with the substrate, and the insulating and heat dissipating material fills an insulating space formed between the second surface and the electrical conductor.

5. The electronic device of claim 1, wherein
the heat sink integrally includes a heat sink body and a protruding portion, the protruding portion protruding from the heat sink body and toward the substrate,
the second surface is a surface of the protruding portion that faces the insulator portion, and
the first surface is a surface of a region of the heat sink body that faces the electrical conductor.

6. The electronic device of claim 5, wherein
the heat sink integrally includes the support portion, the heat sink body, and the protruding portion, the support portion protruding from the heat sink body and toward the substrate and supporting the substrate.

7. The electronic device of claim 5, wherein
the heat sink includes a plurality of the protruding portion for one of the electronic component, and is configured to suppress tilting of the electronic component.

8. The electronic device of claim 5, wherein
the heat sink includes the protruding portion having a shape that is configured to provide continuously abutting with the insulator portion of the electronic component, and that is configured to suppress tilting of the electronic component.

9. The electronic device of claim 5, wherein
the heat sink includes the protruding portion having a shape that allows continuously abutting with a plurality of insulator portions of a plurality of electronic components.

10. The electronic device of claim 1, wherein
the heat sink includes a heat sink body and a recessed portion that is indented from the heat sink body and away from the substrate,
the second surface is a surface of a region of the heat sink body that faces the insulator portion, and
the first surface is an inner surface of the recessed portion.

11. A drive device, comprising:
a motor unit, for an electric power steering device, that outputs steering assist torque;
a controller that drives the motor unit; and
the electronic device of claim 1, the electronic device being used in the controller.

12. The electronic device of claim 1, wherein
the insulating and heat dissipating material is further interposed between the insulator portion and the second surface.

13. The electronic device of claim 12, wherein
the second surface is configured to be abuttable with the insulator portion.

14. The electronic device of claim 1, wherein the insulating and heat dissipating material comprises a heat dissipating gel.

15. An electronic device, comprising:
a substrate;
an electronic component which is mounted on the substrate and includes a chip, an electrical conductor electrically connected to the chip, and an insulator portion that molds the chip with the electrical conductor;
an insulating and heat dissipating material disposed on a side of the electronic component opposite from the substrate; and
a heat sink that includes a first surface, a second surface and a support portion, the support portion being formed away from the first surface and the second surface, and a distal end portion of the support portion being fixed to the substrate to space the electronic component away from the first surface and the second surface,
wherein
the heat sink is configured to absorb heat which is generated from the electronic component,
the first surface faces the electrical conductor, which is exposed at the side of the electronic component opposite from the substrate, such that the insulating and heat dissipating material is interposed between the first surface and the electrical conductor,
the second surface is positioned closer toward the substrate than the first surface is,
the second surface is positioned directly below the insulator portion to face the insulator portion and is spaced away from the insulator portion by a particular spacing,
the heat dissipating material is further interposed between the insulator portion and the second surface, and
the second surface is configured to be abuttable with the insulator portion.

16. The electronic device of claim 15, wherein the second surface is configured to prevent contact between the heat sink and the electrical conductor.

17. An electronic device, comprising:
a substrate;
an electronic component which is mounted on the substrate and includes a chip, an electrical conductor electrically connected to the chip, and an insulator portion that molds the chip with the electrical conductor;
an insulating and heat dissipating material disposed on a side of the electronic component opposite from the substrate; and
a heat sink that includes a first surface, a second surface and a support portion, the support portion being formed away from the first surface and the second surface, and a distal end portion of the support portion being fixed to the substrate to space the electronic component away from the first surface and the second surface,
wherein
the heat sink is configured to absorb heat which is generated from the electronic component,
the first surface faces the electrical conductor, which is exposed at the side of the electronic component opposite from the substrate, such that the insulating and heat dissipating material is interposed between the first surface and the electrical conductor,
the second surface is positioned closer toward the substrate than the first surface is,
the second surface is positioned to overlap with the insulator portion when viewed along a direction orthogonal to the second surface so as to face the insulator portion and is spaced away from the insulator portion by a particular spacing, and
no portion of the second surface overlaps with the electronic conductor when viewed along the direction orthogonal to the second surface.

* * * * *